(12) United States Patent
He et al.

(10) Patent No.: US 6,621,667 B1
(45) Date of Patent: Sep. 16, 2003

(54) GIANT MAGNETORESISTIVE SENSOR WITH A MULTILAYER CAP LAYER

(75) Inventors: Qing He, Bloomington, MN (US);
Song S. Xue, Eden Prairie, MN (US);
Xuefei Tang, Eden Prairie, MN (US);
Bryan K. Oliver, Ames, IA (US);
Patrick J. Ryan, St. Paul, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 162 days.

(21) Appl. No.: 09/908,244

(22) Filed: Jul. 18, 2001

Related U.S. Application Data
(60) Provisional application No. 60/225,342, filed on Aug. 15, 2000.

(51) Int. Cl.$^7$ ................................................. G11B 5/39
(52) U.S. Cl. .......................... 360/324.12; 360/324.1
(58) Field of Search ........................ 360/324, 324.1, 360/324.11, 324.12

(56) References Cited

U.S. PATENT DOCUMENTS

| | | | | |
|---|---|---|---|---|
| 5,862,021 A | * | 1/1999 | Deguchi et al. | 360/324.11 |
| 5,920,446 A | * | 7/1999 | Gill | 360/324 |
| 6,134,090 A | * | 10/2000 | Mao et al. | 360/324.1 |
| 6,208,491 B1 | * | 3/2001 | Pinarbasi | 360/324.1 |
| 6,266,218 B1 | * | 7/2001 | Carey et al. | 360/324.12 |

* cited by examiner

Primary Examiner—William Korzuch
Assistant Examiner—Mark Blouin
(74) Attorney, Agent, or Firm—Kinney & Lange, P.A.

(57) ABSTRACT

A giant magnetoresistive spin valve for use in a magnetic read head includes a ferromagnetic free layer and a multilayer cap layer. The free layer has a rotatable magnetic moment. The multilayer cap layer is positioned adjacent to the free layer for increasing electron specular scattering of the free layer.

16 Claims, 9 Drawing Sheets

GIANT MAGNETORESISTIVE SENSOR WITH A MULTILAYER CAP LAYER

CROSS-REFERENCE TO RELATED APPLICATION(S)

This application claims priority from Provisional Application No. 60/225,342, filed Aug. 15, 2000 for "High Sensitivity Spin-Valve Sensor with Trilayer Cap Layer" by Q. He, S. Xue, X. Tang, B. Oliver and P. Ryan.

BACKGROUND OF THE INVENTION

The present invention relates generally to a giant magnetoresistive sensor for use in a magnetic read head. In particular, the present invention relates to a giant magnetoresistive read sensor having an enhanced giant magnetoresistive response and a reduced giant magnetoresistive dependence on cap layer thickness.

Giant magnetoresistive (GMR) read sensors are used in magnetic data storage systems to detect magnetically-encoded information stored on a magnetic data storage medium such as a magnetic disc. A time-dependent magnetic field from a magnetic medium directly modulates the resistivity of the GMR read sensor. A change in resistance of the GMR read sensor can be detected by passing a sense current through the GMR read sensor and measuring the voltage across the GMR read sensor. The resulting signal can be used to recover the encoded information from the magnetic medium.

A typical GMR read sensor configuration is the GMR spin valve, in which the GMR read sensor is a multi-layered structure formed of a nonmagnetic spacer layer positioned between a ferromagnetic pinned layer and a ferromagnetic free layer. When the pinned layer is deposited prior to the deposition of the free layer, the configuration is known as a bottom spin valve (BSV). The magnetization of the pinned layer is fixed in a predetermined direction, typically normal to an air bearing surface of the GMR read sensor, while the magnetization of the free layer rotates freely in response to an external magnetic field. The resistance of the GMR read sensor varies as a function of an angle formed between the magnetization direction of the free layer and the magnetization direction of the pinned layer. This multi-layered spin valve configuration allows for a more pronounced magnetoresistive effect, i.e. greater sensitivity and higher total change in resistance, than is possible with anisotropic magnetoresistive (AMR) read sensors, which generally consist of a single ferromagnetic layer.

A pinning layer is typically exchange coupled to the pinned layer to fix the magnetization of the pinned layer in a predetermined direction. The pinning layer is typically formed of an antiferromagnetic material. In antiferromagnetic materials, the magnetic moments of adjacent atoms point in opposite directions and, thus, there is no net magnetic moment in the material.

A seed layer is typically used to promote the texture and enhance the grain growth of the pinning layer consequently grown on top of it. The seed layer material is chosen such that its atomic structure, or arrangement, corresponds with the preferred crystallographic direction of the magnetization of the pinning layer material.

One principal concern in the performance of GMR read sensors is the maximum absolute change in resistance of the GMR read sensor, which directly affects the GMR ratio. GMR ratio (the maximum absolute change in resistance of the GMR read sensor divided by the resistance of the GMR read sensor multiplied by 100%) determines the magnetoresistive effect of the GMR read sensor. Ultimately, a higher GMR ratio yields a GMR read sensor with a greater magnetoresistive effect which is capable of detecting information from a magnetic medium with a higher linear density of data.

A recent method of increasing the GMR ratio in bottom spin valves is through the use of an oxide cap layer. Typically, an oxide cap layer is deposited on top of the free layer to function as a reflective layer for increasing the electron specular scattering at the free layer/cap layer interface. This increases the change in resistance of the bottom spin valve and thus increases the GMR ratio. In practice, however, oxide cap layers are not structurally perfect but instead contain pinholes and other material defects. If the oxide cap, layer is too thin, portions of the free layer will be exposed and become oxidized. This causes both the interlayer coupling field and the coercivity of the free layer to increase, requiring a greater applied magnetic field from a magnetic data storage medium to produce a given giant magnetoresistive response. If the oxide cap layer is too thick, there is a significant drop in the GMR ratio, and the interlayer coupling field becomes very high and oscillates with the oxide cap layer thickness. Therefore, the properties of a bottom spin valve capped with a single oxide layer are very sensitive to the thickness of the oxide cap layer.

Accordingly, there is a need for a GMR read sensor having an enhanced giant magnetoresistive response and a reduced giant magnetoresistive dependence on cap layer thickness.

BRIEF SUMMARY OF THE INVENTION

The present invention is a giant magnetoresistive spin valve for use in a magnetic read head. The spin valve includes a ferromagnetic free layer and a multilayer cap layer. The free layer has a rotatable magnetic moment. The multilayer cap layer is positioned adjacent to the free layer for increasing electron specular scattering of the free layer. In one preferred embodiment, the multilayer cap layer includes at least one oxide layer positioned adjacent to the free layer, and at least one conductive layer positioned adjacent to the oxide layer.

DETAILED DESCRIPTION

The present invention is a giant magnetoresistive (GMR) spin valve utilizing a novel multilayer cap layer positioned adjacent to a ferromagnetic free layer for increasing electron specular scattering of the free layer. This novel multilayer cap layer includes at least one oxide layer and at least one conductive layer, and has been shown to improve the specular scattering of several configurations of GMR spin valves, including GMR spin valves having pinned and free layers formed of a single layer or several layers of ferromagnetic material, and GMR spin valves having no seed layer, or seed layers formed of a single layer or several layers. Generally, multiple layer pinned, free, and seed layers will yield a higher GMR response.

Figure 1:
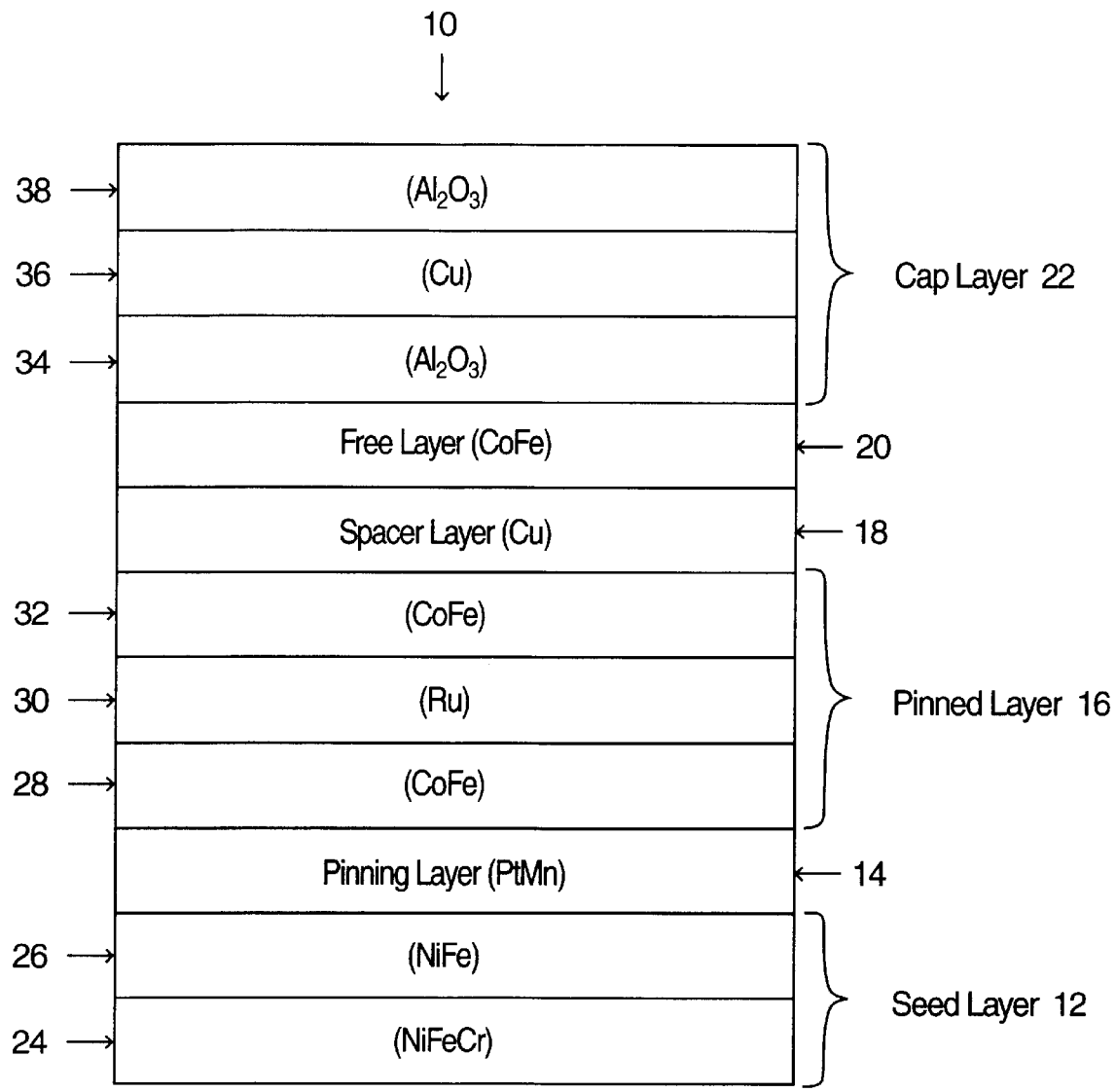
FIG. 1 is a layer diagram of a first embodiment of a giant magnetoresistive stack of the present invention.

FIG. 1 is a layer diagram of a first embodiment of a giant magnetoresistive (GMR) stack 10 of the present invention. GMR stack 10 is configured as a bottom spin valve and includes a seed layer 12, a pinning layer 14, a pinned layer 16, a spacer layer 18, a free layer 20, and a cap layer 22. Seed layer 12 includes a first layer 24, preferably NiFeCr, and a second layer 26, preferably NiFe. Pinning layer 14 is an antiferromagnetic material, preferably selected from the group consisting of CrMnCu, CrMnPd, CrMnPt, IrMn, NiMn NiMnCr, PdMn, PdPtMn, PtMn, and PtRuMn, and is positioned adjacent to the second layer 26 of seed layer 12. Pinned layer 16 is a synthetic antiferromagnet and includes first and second ferromagnetic layers 28 and 32, both preferably CoFe, and a coupling layer 30, preferably ruthenium, positioned between first and second ferromagnetic layers 28 and 32, and is positioned such that first ferromagnetic layer 28 is adjacent to pinning layer 14. Spacer layer 18 is a nonmagnetic material, preferably copper, and is positioned adjacent to second ferromagnetic layer 32 of pinned layer 16. Free layer 20 is a ferromagnetic material, preferably CoFe, and is positioned adjacent to spacer layer 18. Cap layer 22 includes first and second oxide layers 34 and 38, and a conductive layer 36 positioned between first and second oxide layers 34 and 38, and is positioned such that first oxide layer 34 is adjacent to free layer 20. First and second oxide layers 34 and 38 are each oxides in which a metal or semiconductor is combined with oxygen, for example $Al_2O_3$, $Y_2O_3$, and $ZrO_2$. Conductive layer 36 is a metal or metal alloy capable of complete oxidation during high temperature annealing, for example copper, or aluminum.

The magnetization of pinned layer 16 is fixed in a predetermined direction while the magnetization of free layer 20 rotates freely in response to an external magnetic field emanating from a magnetic medium. The resistance of GMR stack 10 varies as a function of an angle that is formed between the magnetization of pinned layer 16 and the magnetization of free layer 20. The magnetization of pinned layer 16 is pinned by exchange coupling pinning layer 14 with pinned layer 16. The atomic structure of seed layer 12 promotes the crystallographic texture and enhances the grain growth of pinning layer 14.

Cap layer 22 functions as a reflective layer and increases the electron specular scattering at the interface between free layer 20 and cap layer 22. This is primarily accomplished by first and second oxide layers 34 and 38. Conductive layer 36 functions to overcome the structural defects (such as pinholes) of first oxide layer 34 and cover any exposed portions of free layer 20. This prevents free layer 20 from becoming oxidized, and prevents the interlayer coupling field and coercivity of free layer 20 from increasing. In addition, conductive layer 36 becomes completely oxidized between first and second oxide layers 34 and 38 after high temperature annealing. This ensures that there is no current shunting between first and second oxide layers 34 and 38. Therefore, the giant magnetoresistive dependence of GMR stack 10 on the thickness of cap layer 22 is reduced.

The thickness of free layer 20 is preferably in the range of about 5 Å to about 50 Å, and more preferably in the range of about 15 Å to about 35 Å.

The thicknesses of first and second oxide layers 34 and 38 of cap layer 22 are each preferably in the range of about 5 Å to about 50 Å, and the thickness of conductive layer 36 of cap layer 22 is preferably in the range of about 1 Å to about 100 Å.

Figure 2:
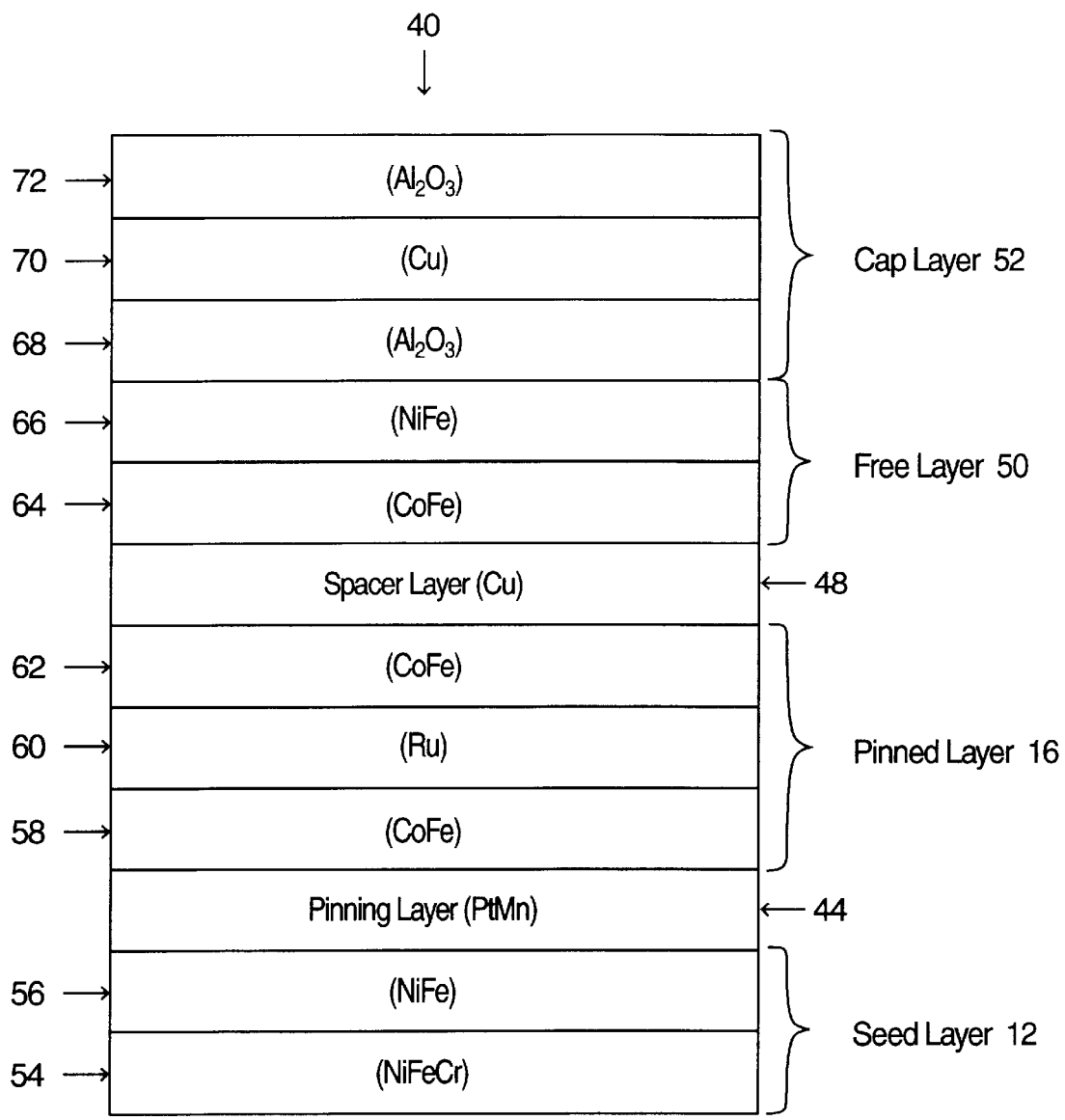
FIG. 2 is a layer diagram of a second embodiment of a giant magnetoresistive stack of the present invention.

FIG. 2 is a layer diagram of a second embodiment of a GMR stack 40 of the present invention. GMR stack 40 is configured as a bottom spin valve and includes a seed layer 42, a pinning layer 44, a pinned layer 46, a spacer layer 48, a free layer 50, and a cap layer 52. GMR stack 40 is similar to GMR stack 10 of FIG. 1, except that free layer 50 of GMR stack 40 is a bilayer, while free layer 20 of GMR stack 10 is a single ferromagnetic layer.

Seed layer 42 includes a first layer 54, preferably NiFeCr, and a second layer 56, preferably NiFe. Pinning layer 44 is an antiferromagnetic material, preferably selected from the group consisting of CrMnCu, CrMnPd, CrMnPt, IrMn, NiMn NiMnCr, PdMn, PdPtMn, PtMn, and PtRuMn, and is positioned adjacent to the second layer 56 of seed layer 42. Pinned layer 46 is a synthetic antiferromagnet and includes first and second ferromagnetic layers 58 and 62, both preferably CoFe, and a coupling layer 60, preferably ruthenium, positioned between first and second ferromagnetic layers 58 and 62, and is positioned such that first ferromagnetic layer 58 is adjacent to pinning layer 44. Spacer layer 48 is a nonmagnetic material, preferably copper, and is positioned adjacent to second ferromagnetic layer 62 of pinned layer 46. Free layer 50 includes a first ferromagnetic layer 64, preferably CoFe, and a second ferromagnetic layer 66, preferably NiFe, and is positioned such that first ferromagnetic layer 64 is adjacent to spacer layer 48. Cap layer 52 includes first and second oxide layers 68 and 72, and a conductive layer 70 positioned between first and second oxide layers 68 and 72, and is positioned such that first oxide layer 68 is adjacent to second ferromagnetic layer 66 of free layer 50. First and second oxide layers 68 and 72 are each oxides in which a metal or semiconductor is combined with oxygen, for example $Al_2O_3$, $Y_2O_3$, and $ZrO_2$. Conductive layer 70 is a metal or metal alloy capable of complete oxidation during high temperature annealing, for example copper, or aluminum.

The magnetization of pinned layer 46 is fixed in a predetermined direction while the magnetization of free layer 50 rotates freely in response to an external magnetic field emanating from a magnetic medium. The resistance of GMR stack 40 varies as a function of an angle that is formed between the magnetization of pinned layer 46 and the magnetization of free layer 50. The magnetization of pinned layer 46 is pinned by exchange coupling pinning layer 44 with pinned layer 46. The atomic structure of seed layer 42 promotes the crystallographic texture and enhances the grain growth of pinning layer 44.

Cap layer 52 functions as a reflective layer and increases the electron specular scattering at the interface between free layer 50 and cap layer 52. This is primarily accomplished by first and second oxide layers 68 and 72. Conductive layer 70 functions to overcome the structural defects (such as pinholes) of first oxide layer 68 and cover any exposed portions of free layer 50. This prevents free layer 50 from becoming oxidized, and prevents the interlayer coupling field and coercivity of free layer 50 from increasing. In addition, conductive layer 70 becomes completely oxidized between first and second oxide layers 68 and 72 after high temperature annealing. This ensures that there is no current shunting between first and second oxide layers 68 and 72. Therefore, the giant magnetoresistive dependence of GMR stack 40 on the thickness of cap layer 52 is reduced.

The thicknesses of first and second ferromagnetic layers 64 and 66 of free layer 50 are each preferably in the range of about 5 Å to about 50 Å, and more preferably in the range of about 15 Å to about 35 Å.

The thicknesses of first and second oxide layers 68 and 72 of cap layer 52 are each preferably in the range of about 5 Å to about 50 Å, and the thickness of conductive layer 70 of cap layer 52 is preferably in the range of about 1 Å to about 100 Å.

Figure 3:
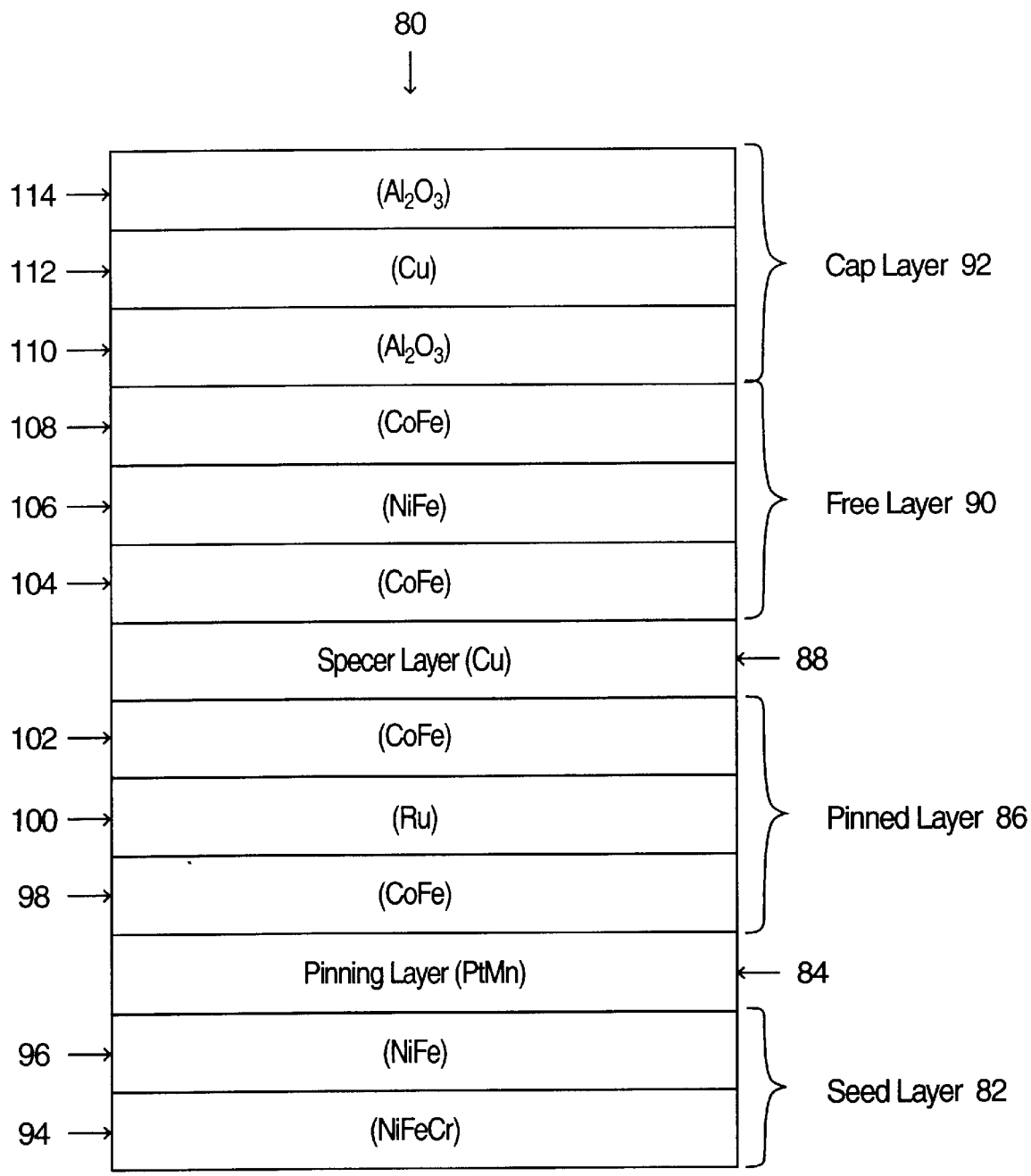
FIG. 3 is a layer diagram of a third embodiment of a giant magnetoresistive stack of the present invention.

FIG. 3 is a layer diagram of a third embodiment of a GMR stack 80 of the present invention. GMR stack 80 is configured as a bottom spin valve and includes a seed layer 82, a pinning layer 84, a pinned layer 86, a spacer layer 88, a free layer 90, and a cap layer 92. GMR stack 80 is similar to GMR stack 10 of FIG. 1, except that free layer 90 of GMR stack 80 is a trilayer, while free layer 20 of GMR stack 10 is a single ferromagnetic layer.

Seed layer 82 includes a first layer 94, preferably NiFeCr, and a second layer 96, preferably NiFe. Pinning layer 84 is an antiferromagnetic material, preferably selected from the group consisting of CrMnCu, CrMnPd, CrMnPt, IrMn, NiMn NiMnCr, PdMn, PdPtMn, PtMn, and PtRuMn, and is positioned adjacent to the second layer 96 of seed layer 82. Pinned layer 86 is a synthetic antiferromagnet and includes first and second ferromagnetic layers 98 and 102, both preferably CoFe, and a coupling layer 100, preferably ruthenium, positioned between first and second ferromagnetic layers 98 and 102, and is positioned such that first ferromagnetic layer 98 is adjacent to pinning layer 84. Spacer layer 88 is a nonmagnetic material, preferably copper, and is positioned adjacent to second ferromagnetic layer 102 of pinned layer 86. Free layer 90 includes first and third ferromagnetic layers 104 and 108, both preferably CoFe, and a second ferromagnetic layer 106, preferably NiFe, positioned between first and third ferromagnetic layers 104 and 108, and is positioned such that first ferromagnetic layer 104 is adjacent to spacer layer 88. Cap layer 92 includes first and second oxide layers 110 and 114, and a conductive layer 112 positioned between first and second oxide layers 110 and 114, and is positioned such that first oxide layer 110 is adjacent to third ferromagnetic layer 108 of free layer 90. First and second oxide layers 110 and 114 are each oxides in which a metal or semiconductor is combined with oxygen, for example $Al_2O_3$, $Y_2O_3$, and $ZrO_2$. Conductive layer 36 is a metal or metal alloy capable of complete oxidation during high temperature annealing, for example copper, or aluminum.

The magnetization of pinned layer 86 is fixed in a predetermined direction while the magnetization of free layer 90 rotates freely in response to an external magnetic field emanating from a magnetic medium. The resistance of GMR stack 80 varies as a function of an angle that is formed between the magnetization of pinned layer 86 and the magnetization of free layer 90. The magnetization of pinned layer 86 is pinned by exchange coupling pinning layer 84 with pinned layer 86. The atomic structure of seed layer 82 promotes the crystallographic texture and enhances the grain growth of pinning layer 84.

Cap layer 92 functions as a reflective layer and increases the electron specular scattering at the interface between free layer 90 and cap layer 92. This is primarily accomplished by first and second oxide layers 110 and 114. Conductive layer 112 functions to overcome the structural defects (such as pinholes) of first oxide layer 110 and cover any exposed portions of free layer 90. This prevents free layer 90 from becoming oxidized, and prevents the interlayer coupling field and coercivity of free layer 90 from increasing. In addition, conductive layer 112 becomes completely oxidized between first and second oxide layers 110 and 114 after high temperature annealing. This ensures that there is no current shunting between first and second oxide layers 110 and 114. Therefore, the giant magnetoresistive dependence of GMR stack 80 on the thickness of cap layer 92 is reduced.

The thicknesses of first, second, and third ferromagnetic layers 104, 106 and 108 of free layer 90 are each preferably in the range of about 5 Å to about 50 Å, and more preferably in the range of about 15 Å to about 35 Å.

The thicknesses of first and second oxide layers 110 and 114 of cap layer 92 are each preferably in the range of about 5 Å to about 50 Å, and the thickness of conductive layer 112 of cap layer 92 is preferably in the range of about 1 Å to about 100 Å.

Figure 4:
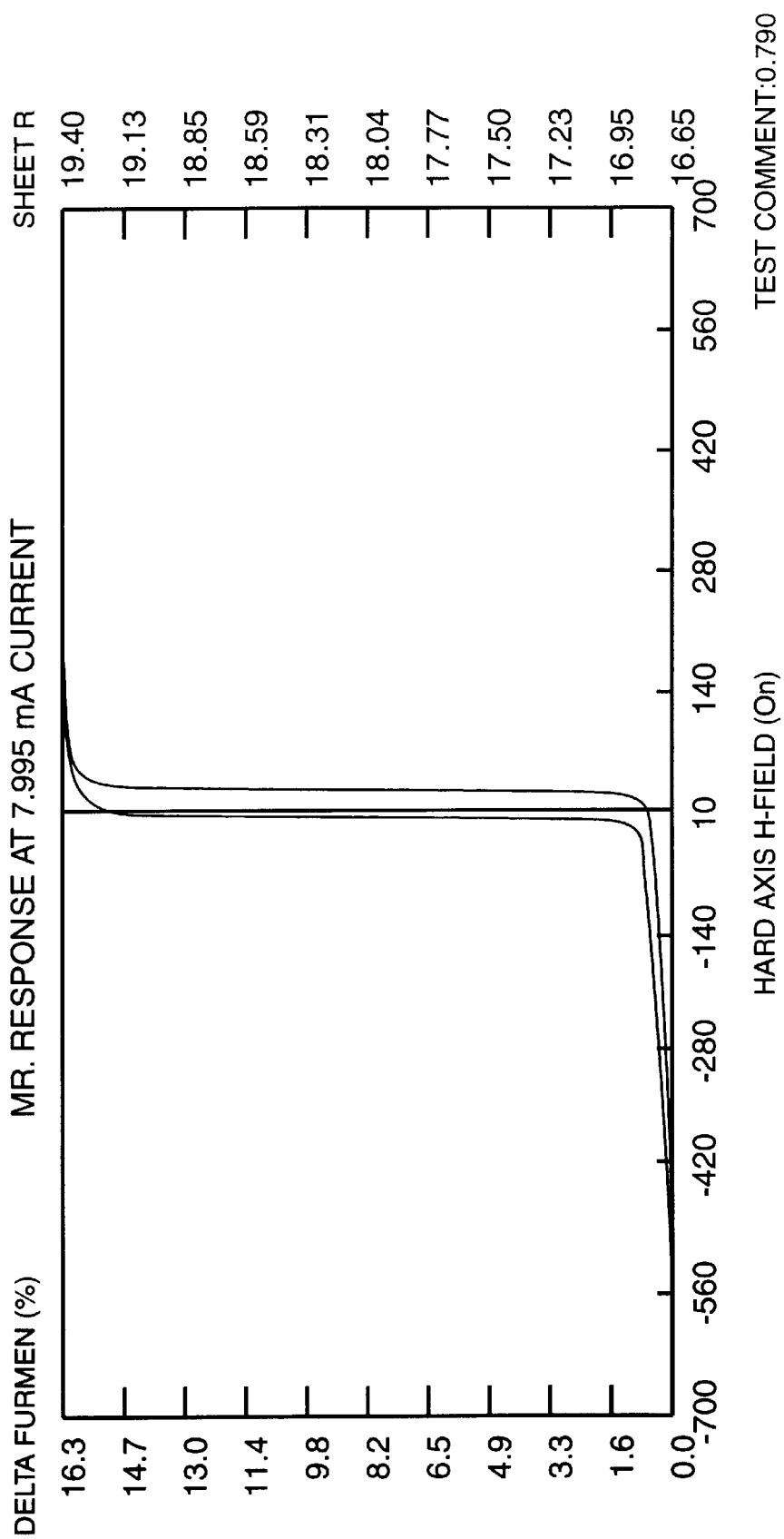
FIG. 4 is a graph of the GMR response of the first embodiment of a giant magnetoresistive stack of the present invention as a function of applied magnetic field.

FIG. 4 is a graph of the GMR response of GMR stack 10 of the present invention as a function of an applied magnetic field. The graph shows both the GMR ratio (%) and the change in resistance (Ω) of GMR stack 10 as a function of an applied magnetic field (Oe). The GMR ratio of GMR stack 10 equals 16.3%. The maximum absolute change in sheet resistance of GMR stack 10 equals 2.74 Ω/sq.

Figure 5:
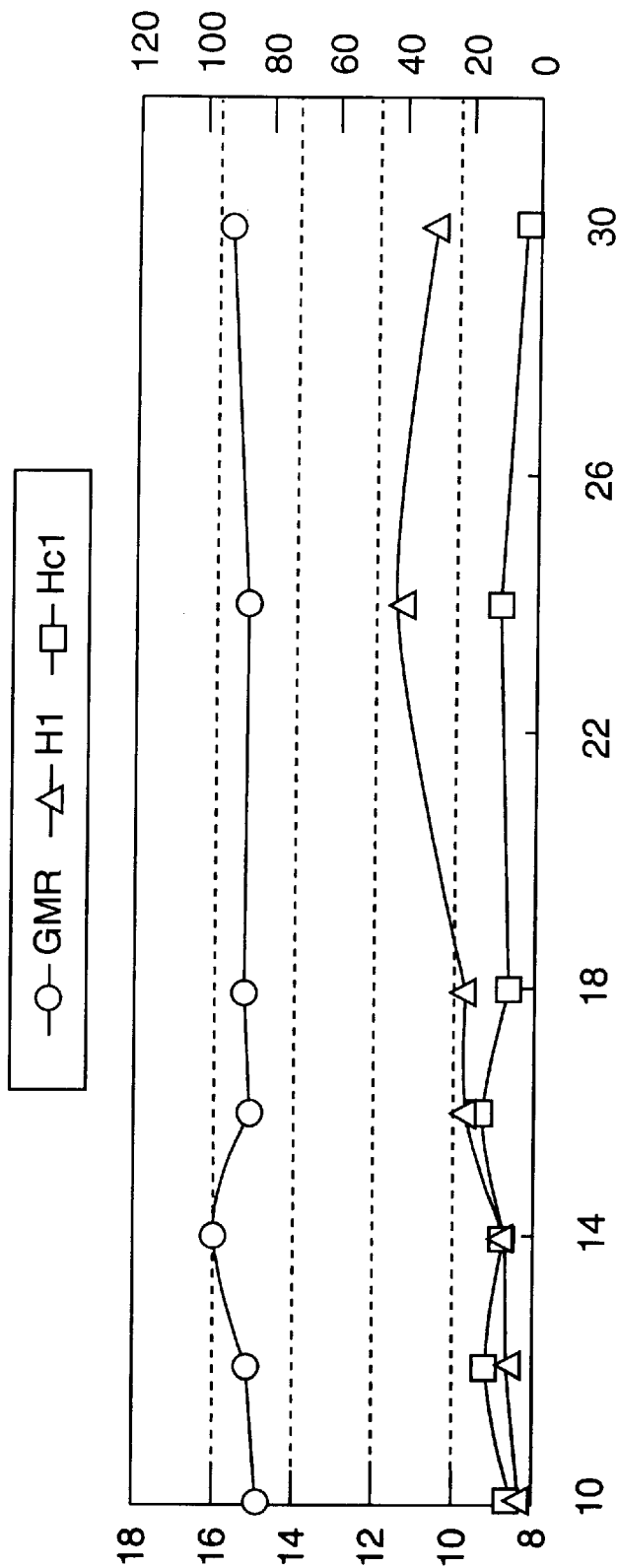
FIG. 5 is a graph of the GMR response of the first embodiment of a giant magnetoresistive stack of the present invention as a function of first oxide layer thickness.

FIG. 5 is a graph of the GMR response of GMR stack 10 of the present invention as a function of the thickness (Å) of the first oxide layer 34 of cap layer 22 of GMR stack 10. The graph illustrates that the GMR ratio (%) of GMR stack 10, and the exchange coupling field H1 (Oe) and the coercivity Hc1 (Oe) of free layer 20 each remain fairly constant throughout the thickness range of first oxide layer 38 from about 10 Å to over 30 Å.

Figure 6:
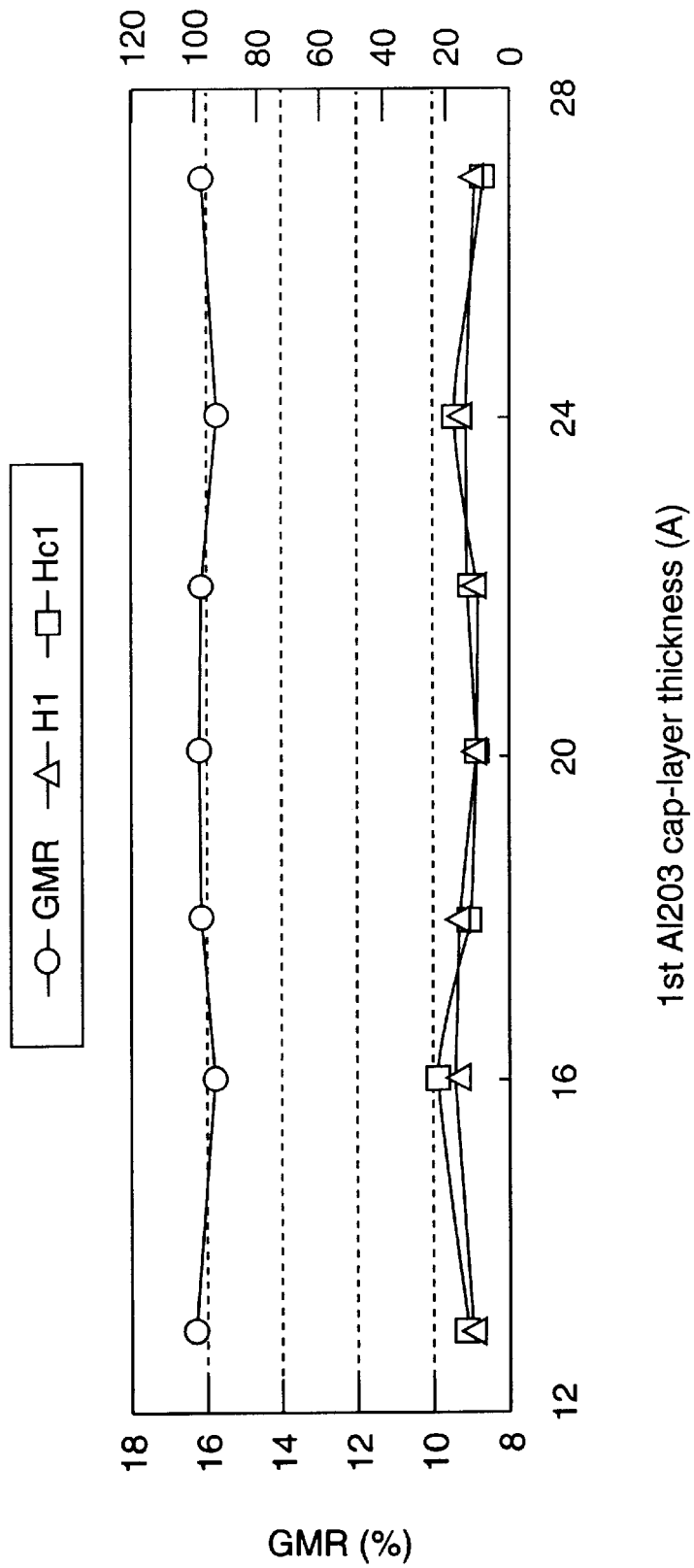
FIG. 6 is a graph of the GMR response of the first embodiment of a giant magnetoresistive stack of the present invention as a function of conductive layer thickness.

FIG. 6 is a graph of the GMR response of GMR stack 10 of the present invention as a function of the thickness (Å) of the conductive layer 36 of cap layer 22 of GMR stack 10. The graph illustrates that the GMR ratio (%) of GMR stack 10, and the exchange coupling field H1 (Oe) and the coercivity Hc1 (Oe) of free layer 20 each remain fairly constant throughout the thickness range of conductive layer 36 from about 13 Å to over 27 Å.

Figure 7:
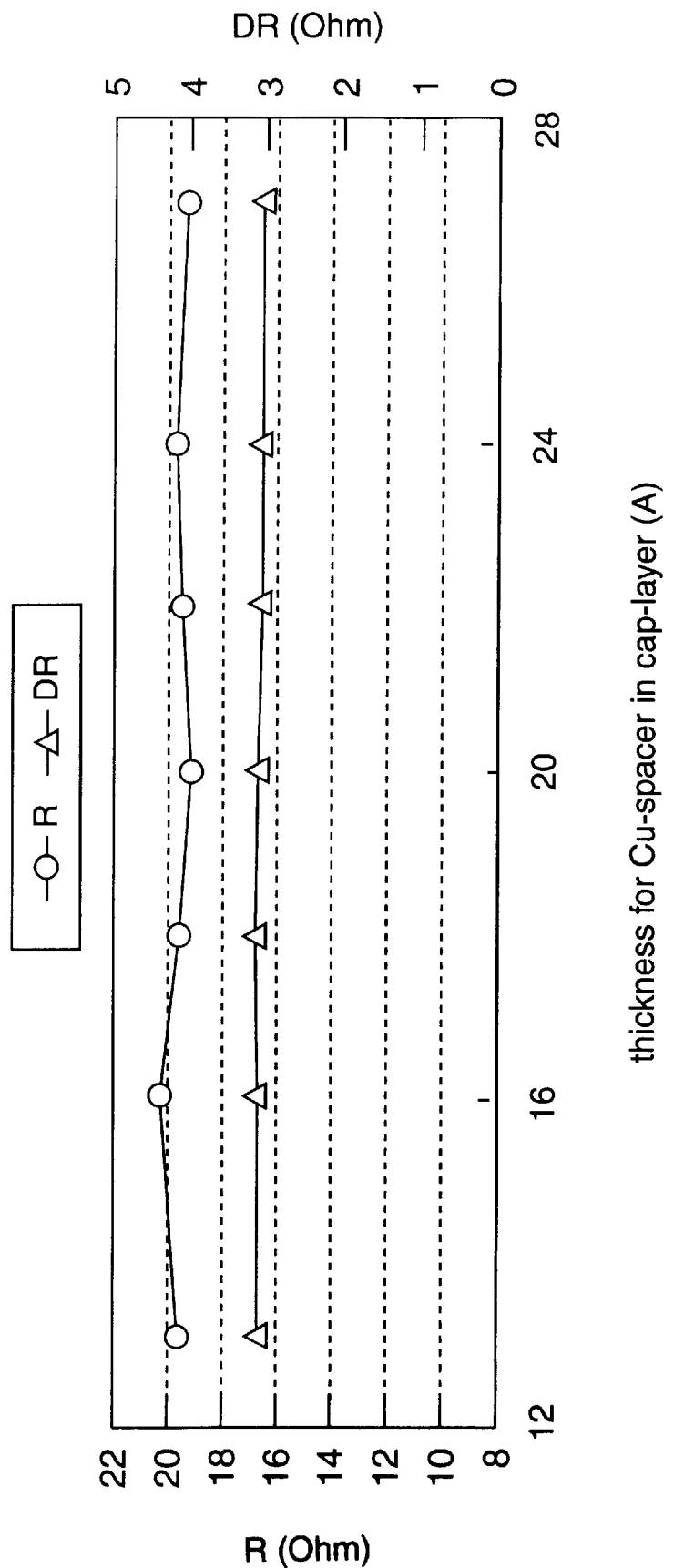
FIG. 7 is a graph of the resistance and the change in resistance of the first embodiment of a giant magnetoresistive stack of the present invention as a function of conductive layer thickness.

FIG. 7 is a graph of the resistance (Ω) and the change in resistance (Ω) of GMR stack 10 of the present invention as a function of the thickness (Å) of the conductive layer 36 of cap layer 22 of GMR stack 10. The graph illustrates that the sheet resistance and the maximum absolute change in sheet resistance of GMR stack 10 each remain fairly constant throughout the thickness range of conductive layer 36 from about 13 Å to over 27 Å.

Figure 8:
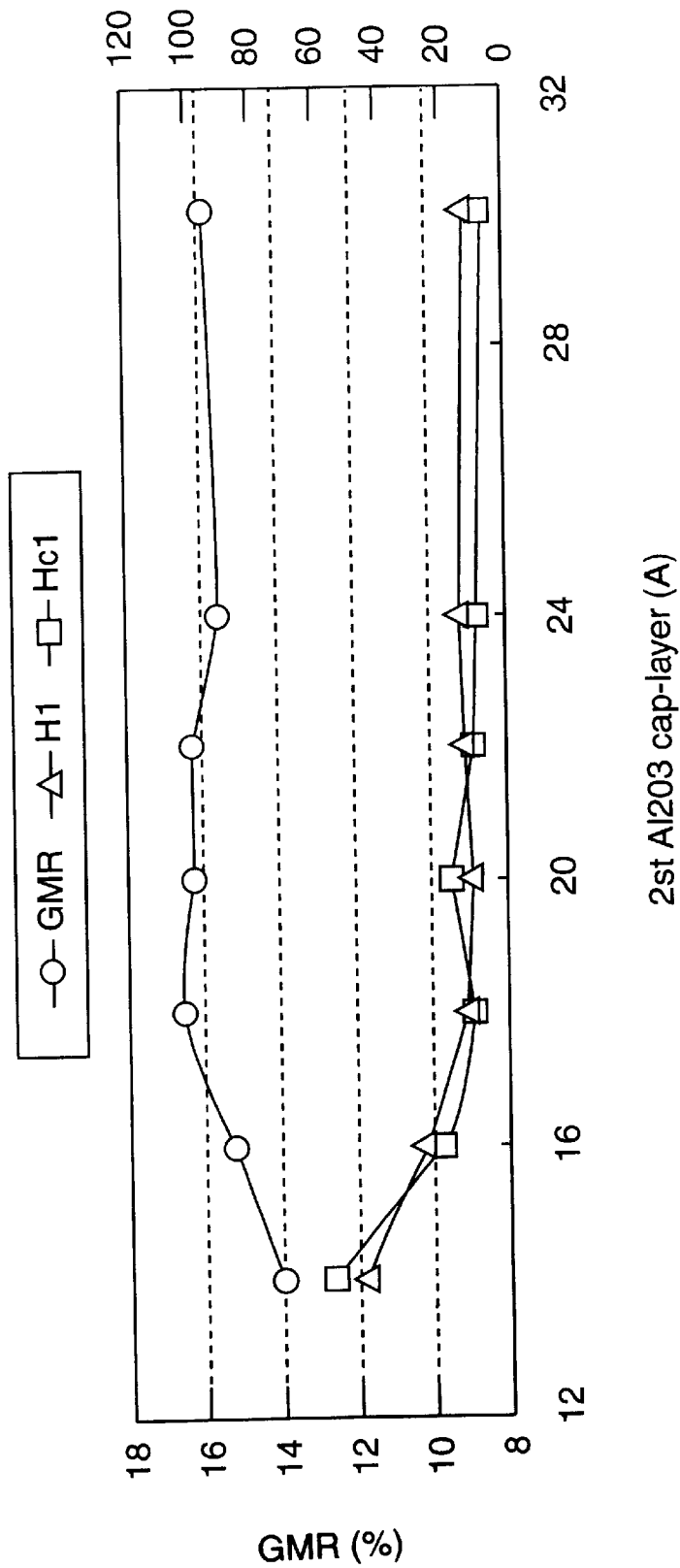
FIG. 8 is a graph of the GMR response of the first embodiment of a giant magnetoresistive stack of the present invention as a function of second oxide layer thickness.

FIG. 8 is a graph of the GMR response of GMR stack 10 of the present invention as a function of the thickness (Å) of the second oxide layer 38 of cap layer 22 of GMR stack 10. The graph illustrates that the GMR ratio (%) of GMR stack 10, and the exchange coupling field H1 (Oe) and the coercivity Hc1 (Oe) of free layer 20 each remain fairly constant throughout the thickness range of second oxide layer 38 from about 18 Å to over 30 Å.

Figure 9:
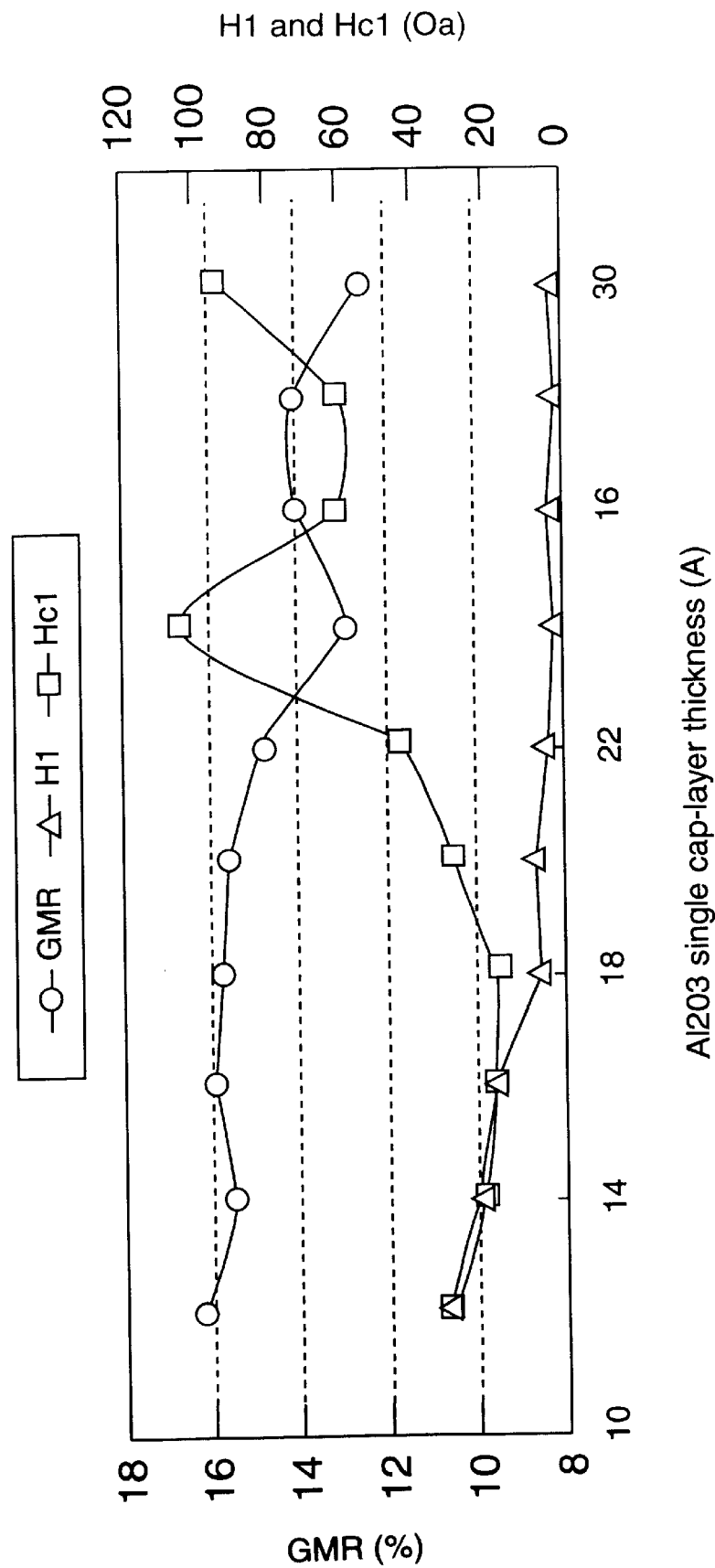
FIG. 9 is a graph of the GMR response of a giant magnetoresistive stack not of the present invention as a function of cap layer thickness.

FIG. 9 is a graph of the GMR response of a GMR stack not of the present invention. This GMR stack is similar to GMR stack 10 of FIG. 1 except that it has a single $Al_2O_3$ cap layer instead of a multilayer cap layer. The graph illustrates that the GMR ratio (%) of this GMR stack, and the exchange coupling field H1 (Oe) and the coercivity Hc1 (Oe) of its free layer are each very sensitive to the thickness of the single $Al_2O_3$ cap layer. When the cap layer thickness is below approximately 14 Å, both the exchange coupling field H1 and the coercivity Hc1 increase. When the cap layer thickness is above approximately 20 Å, the GMR ratio decreases, and the exchange coupling field H1 increases dramatically and oscillates with the cap layer thickness.

In summary, the present invention introduces a GMR read sensor having a multilayer cap layer positioned adjacent to a ferromagnetic free layer for increasing electron specular scattering of the free layer. The multilayer cap layer includes at least one oxide layer and at least one conductive layer, and provides a GMR read sensor with an enhanced GMR response and a reduced GMR dependence on cap layer thickness.

Although the present invention has been described with reference to preferred embodiments, workers skilled in the art will recognize that changes may be made in form and detail without departing from the spirit and scope of the invention.

What is claimed is:

1. A giant magnetoresistive sensor comprising:
    a bottom spin valve having a free layer and a cap, wherein the cap includes a first oxide layer adjacent the free layer; and
    means for reducing dependence of properties of the bottom spin valve on thickness of the cap, wherein the means includes a conductive layer adjacent the first oxide layer, and a second oxide layer adjacent the conductive layer.

2. A giant magnetoresistive spin valve for use in a magnetic read head, the spin valve comprising:
    a ferromagnetic free layer having a rotatable magnetic moment; and
    a multilayer cap layer positioned adjacent to the free layer for increasing electron specular scattering of the free layer, wherein the multilayer cap layer comprises:
        a first oxide layer positioned adjacent to the free layer;
        a conductive layer positioned adjacent to the first oxide layer; and
        a second oxide layer positioned adjacent to the conductive layer.

3. The spin value of claim 2 wherein the second oxide layer has a thickness in a range of about 5 Å to about 50 Å.

4. The spin value of claim 2 and further comprising:
    an antiferromagnetic pinning layer;
    a ferromagnetic pinned layer having a fixed magnetic moment positioned adjacent to the pinning layer; and
    a nonmagnetic spacer layer positioned between the pinned layer and the free layer.

5. The spin valve of claim 4 wherein the free layer is CoFe.

6. The spin valve of claim 4 wherein the free layer is a bilayer comprising:
    a CoFe layer positioned adjacent to the spacer layer; and
    a NiFe layer positioned adjacent to the multilayer cap layer.

7. The spin valve of claim 4 wherein the free layer is a trilayer comprising:
    a first CoFe layer positioned adjacent to the spacer layer;
    a second CoFe layer positioned adjacent to the multilayer cap layer; and
    a NiFe layer positioned between the first and second CoFe layers.

8. The spin valve of claim 4 and further comprising a seed layer positioned adjacent to the pinning layer.

9. The spin valve of claim 2 wherein the first oxide layer is a metal combined with oxygen.

10. The spin valve of claim 9 wherein the metal combined with oxygen is selected from the group consisting of $Al_2O_3$, $Y_2O_3$, and $ZrO_2$.

11. The spin valve of claim 2 wherein the first oxide layer is a semiconductor combined with oxygen.

12. The spin valve of claim 2 wherein the first oxide layer has a thickness in a range of about 5 Å to about 50 Å.

13. The spin valve of claim 2 wherein the conductive layer is a metal capable of complete oxidation during annealing.

14. The spin valve of claim 13 wherein the metal is selected from the group consisting of copper and aluminum.

15. The spin valve of claim 2 wherein the conductive layer has a thickness in a range of about 1 Å to about 100 Å.

16. A method for forming a giant magnetoresistive spin valve for use in a magnetic read head, the method comprising:
    depositing a pinning layer of an antiferromagnetic material;
    depositing a pinned layer of a ferromagnetic material over having a magnetic moment over the pinning layer;
    depositing a spacer layer of a nonmagnetic material over the pinned layer;
    depositing a free layer of a ferromagnetic material having a magnetic moment over the spacer layer;
    depositing a first cap layer of an oxide material over the free layer;
    depositing a second cap layer of a conductive material over the first cap layer; and
    depositing a third cap layer of an oxide material over the second cap layer.

* * * * *

UNITED STATES PATENT AND TRADEMARK OFFICE
CERTIFICATE OF CORRECTION

PATENT NO. : 6,621,667 B1
DATED : September 16, 2003
INVENTOR(S) : Qing He et al.

It is certified that error appears in the above-identified patent and that said Letters Patent is hereby corrected as shown below:

Column 7,
Lines 53 and 55, delete "value", insert -- valve --

Signed and Sealed this

Twenty-first Day of September, 2004

JON W. DUDAS
*Director of the United States Patent and Trademark Office*